(12) United States Patent
Armacost et al.

(10) Patent No.: US 6,342,722 B1
(45) Date of Patent: Jan. 29, 2002

(54) INTEGRATED CIRCUIT HAVING AIR GAPS BETWEEN DIELECTRIC AND CONDUCTING LINES

(75) Inventors: Michael Armacost, Wallkill; Peter D. Hoh, Hopewell Junction, both of NY (US); David V. Horak, Essex Junction, VT (US); Richard S. Wise, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/369,082

(22) Filed: Aug. 5, 1999

(51) Int. Cl.[7] .................. H01L 29/00; H01L 27/01; H01L 27/12; H01L 31/0392
(52) U.S. Cl. .................. 257/522; 257/347; 257/350; 257/351
(58) Field of Search ................ 257/347, 350, 257/351, 522

(56) References Cited

U.S. PATENT DOCUMENTS

| | | | |
|---|---|---|---|
| 5,407,860 A | | 4/1995 | Stoltz et al. |
| 5,587,597 A | * | 12/1996 | Reedy et al. ............... 257/531 |
| 5,759,913 A | | 6/1998 | Fulford, Jr. et al. |
| 5,783,864 A | | 7/1998 | Dawson et al. |
| 5,814,555 A | | 9/1998 | Bandyopadhyay et al. |
| 5,959,337 A | * | 9/1999 | Gardner et al. ............. 257/410 |
| 6,064,107 A | * | 5/2000 | Yeh et al. ................... 257/522 |
| 6,104,077 A | * | 8/2000 | Gardner et al. ............. 257/522 |
| 6,180,988 B1 | * | 1/2001 | Wu ............................. 257/410 |

* cited by examiner

Primary Examiner—Eddie Lee
Assistant Examiner—Jesse A. Fenty
(74) Attorney, Agent, or Firm—Ratner & Prestia; Tiffany L. Townsend, Esq.

(57) ABSTRACT

An integrated circuit and method of making the integrated circuit. Air gaps are formed between surfaces of current-conducting lines that face one another and dielectric material disposed between these surfaces of the current-conducting lines. A liner material is applied to these surfaces of the current-conducting lines and, after the dielectric material is introduced between the current-conducting lines, the liner material is removed, for example by etching, leaving air gaps between the current-conducting lines and the dielectric material. These air gaps eliminate or greatly reduce the effect of capacitive currents across the dielectric material between the current-conducting lines.

7 Claims, 2 Drawing Sheets

INTEGRATED CIRCUIT HAVING AIR GAPS BETWEEN DIELECTRIC AND CONDUCTING LINES

TECHNICAL FIELD

The present invention relates generally to integrated circuit fabrication and, more particularly, to an integrated circuit construction by which the effect of capacitive currents across dielectric material between current conducting lines is eliminated or greatly reduced.

BACKGROUND OF THE INVENTION

As critical dimensions in microelectronics devices shrink, the device speed becomes limited by capacitance across dielectric (or insulator) films. In traditional semiconductor processing technology, the conductive layers are insulated from one another by dielectrics such as silicon dioxide or silicon nitride. As the pitch (i.e., spacing) of the conductive layers is reduced, the conductors begin to communicate with one another via capacitive currents across the dielectric. This effect reduces the effective speed of the devices.

The effect of capacitance across insulator films is reduced as the dielectric constant ("k") of the insulator is reduced. To reduce the effect of line capacitance, insulating materials with lower dielectric constants, so-called low-k materials, are being developed. The materials have a dielectric constant less than silicon dioxide (k=3.85), but greater than a vacuum (k=1) or air (k≈1). Use of such low-k materials results in substantial process penalties, however, because these materials are generally very different from the materials currently in use, requiring changes in the processes for forming the microelectronics devices.

The problems created by capacitive currents across the dielectric between current-carrying conductive lines have been addressed by others in the past. To date, however, there is no known satisfactory solution to the problem of intra-level dielectric capacitive coupling.

U.S. Pat. No. 5,814,555 is issued to Bandyopadhyay et al. is directed to a method which uses the topography of the fill process to form voids in the vertical direction. This method reduces inter-level dielectric capacitive coupling. In contrast to inter-level coupling, intra-level dielectric capacitive coupling is a more critical parameter for device speed. Moreover, the method disclosed in U.S. Pat. No. 5,814,555 is incompatible with dual damascene processing for the back end of line.

U.S. Pat. No. 5,783,864 issued to Dawson et al. is directed to a multilevel interconnect structure of an integrated circuit having air gaps and pillars separating levels of interconnect. The method by which this multilevel interconnect structure is formed requires an additional deep ultraviolet lithography step to form the air gaps. This additional step is cost-prohibitive.

In U.S. Pat. No. 5,759,913 issued to Fulford, Jr. et al., the fill dielectric must provide a high aspect ratio for the fill to avoid subsequent deposition which will, in general, make the metal etch require a much thicker hard mask than is actually required for the metal etch if, in fact, a hard mask is used at all. This results in a reduction in the process window for metal lithography and etch. In addition, the method disclosed in U.S. Pat. No. 5,759,913 is not compatible with dual damascene processing without excessively difficult metal recess steps. Furthermore, this method requires deposition of a hygroscopic dielectric material, limiting the applicability of the method.

In U.S. Pat. No. 5,407,860 issued to Stoltz et al., a selective deposition is used to form air gaps around adjacent current-conducting lines. This selective deposition requires, for example, the application of polytetrafluoroethylene such as Teflon (a trademark of E. I. DuPont deNemours & Co., Inc. of Wilmington, Del.) material. The use of polytetrafluoroethylene or similar materials limits the compatibility of this step with further processing. The presence of such materials which are "nonwetting" also decreases the effective reduction in line coupling because the dielectric of this material is greater than air.

To overcome the shortcomings of known attempts to solve the problem of intra-level dielectric capacitive coupling, a new method for forming an integrated circuit is provided. An object of the present invention is to provide an improved method of formation and an improved integrated circuit that eliminate or greatly reduce the effect of capacitive currents across dielectric material between current-conducting lines. Yet another object of this invention is to avoid the need to deposit a hygroscopic dielectric material, thereby expanding the applicability of the method and device.

Another object is to provide a method and device compatible with dual damascene processing for the back end of line. A related object is to provide a method and device compatible with dual damascene processing without excessively difficult metal recess steps. An additional related object of the present invention is to avoid the use of polytetrafluoroethylene or similar materials that limit the compatibility of the method with further processing. It is still another object of the present invention to eliminate or at least minimize cost-prohibitive method steps.

SUMMARY OF THE INVENTION

To achieve these and other objects, and in view of its purposes, the present invention provides a method for forming an integrated circuit. The method according to the present invention includes the steps of providing a stud dielectric and patterning a metal layer on the stud dielectric. A liner material is deposited on surfaces of lines of the metal layer which face one another. Spaces between surfaces of the liner material which face one another are filled with a dielectric material that is chemically differentiated from the liner material. The liner material is removed to create air gaps between the dielectric material and the surfaces of the lines of the metal layer.

An integrated circuit, constructed in accordance with the method of the present invention, includes a stud dielectric layer, a metal layer having conductive lines on the stud dielectric, and dielectric material in spaces between surfaces of the conductive lines of the metal layer facing one another and spaced from the conductive lines of the metal layer by air gaps.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 shows the structure that results after completing the method steps of providing a stud dielectric and patterning a metal layer having conductive lines on the stud dielectric;

FIG. 2 shows the structure that results after completing the method step of depositing a liner material on the surfaces of the conductive lines of the metal layer that face one another;

FIG. 3 shows the structure that results after completing the method step of filling the spaces between the surfaces of the liner material that face one another with a dielectric material;

FIG. 4 shows the structure that results after completing the method step of removing the liner material to create air gaps between the dielectric material and the surfaces of the conductive lines of the metal layer;

FIG. 5 shows the structure that results after completing the method step of depositing a second stud dielectric.

DETAILED DESCRIPTION OF THE INVENTION

Figure 1:
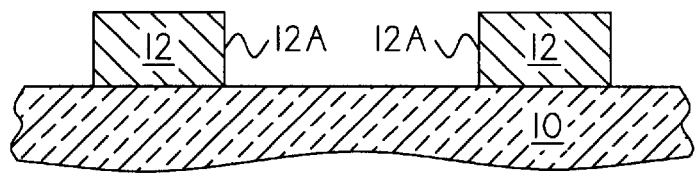
FIGS. 1 through 5 show various stages in the formation of an integrated circuit according to the present invention and, more specifically.

Referring now to the drawing, wherein like reference numbers refer to like elements throughout, a method for forming an integrated circuit, according to the present invention, includes the steps of providing a stud dielectric 10 and patterning a metal layer having conductive lines 12 on the stud dielectric. The structure that results after completing these method steps is shown in FIG. 1. The stud dielectric can be tetraethoxysilane (TEOS) or oxide (e.g., $SiO_2$) and the metal layer can be aluminum or copper.

Figure 2:
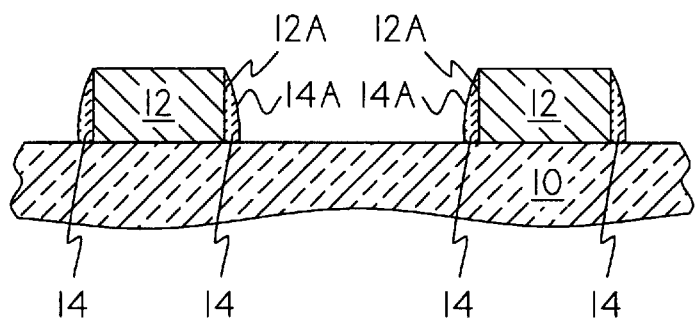

Next, a liner material 14 is deposited on the surfaces 12a of conductive lines 12 of the metal layer that face one another. The structure that results after completing this method step is shown in FIG. 2. The liner material can be silicon nitride.

Figure 3:
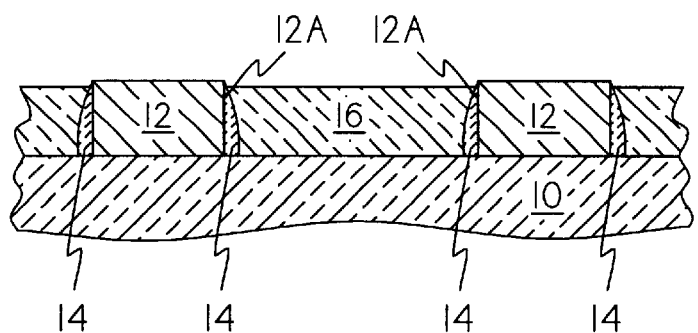

Next, the spaces between the surfaces 14a of liner material 14 that face one another are filled with a dielectric material 16. Dielectric material 16 is chemically different from liner material 14. The structure that results after completing this method step is shown in FIG. 3. Dielectric material 16 can be TEOS or oxide (e.g., $SiO_2$).

Figure 4:
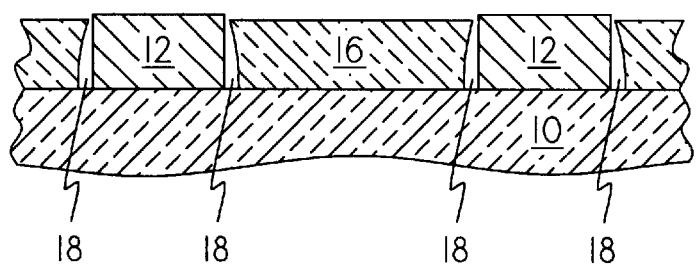

Then, liner material 14 is removed to create air gaps 18 between dielectric material 16 and surfaces 12a of conductive lines 12 of the metal layer. The structure that results after completing this method step is shown in FIG. 4. For the embodiment of the invention being described, liner material 14 is removed by an isotropic etching process, selective to the interlevel dielectric, such as chemical downstream etch. The thickness of liner material 14, and hence the resulting air gap, is determined by the conformality of dielectric material 16.

The resulting structure is an integrated circuit that includes a stud dielectric layer 10, a metal layer having conductive lines 12 on the stud dielectric, and dielectric material 16 in spaces between surfaces of the conductive lines of the metal layer facing one another and spaced from the conductive lines of the metal layer by air gaps 18 formed at sub-lithographic dimensions. These features form a series capacitance lower than the capacitance of dielectric material 16, reducing the capacitance delay between conductive lines 12.

Figure 5:
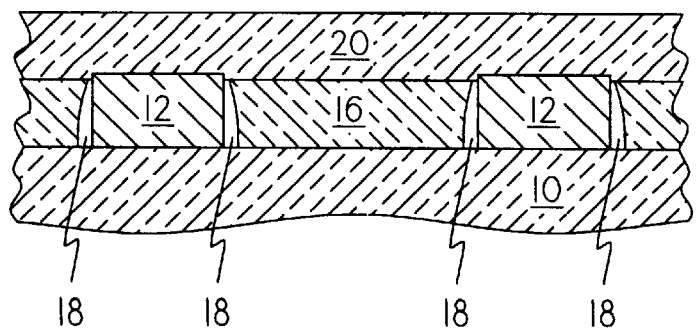

Air gaps 18 taper away downwardly from conductive lines 12. With small openings into air gaps 18 at the top of air gaps 18, when a second layer of stud dielectric 20, for the next level of the integrated circuit, is deposited above conductive lines 12 of the metal layer, air gaps 18, and dielectric material 16, second stud dielectric 20 is inhibited from entering into the air gaps as this stud dielectric is being deposited. FIG. 5 shows the structure that results after second stud dielectric 20 is deposited. The maximum thickness of liner material 14, and hence the resulting air gap 18, is determined by the conformality of second stud dielectric 20. A nonconformal second stud dielectric 20 permits the greatest air gaps 18 and, therefore, the largest benefit of decreased capacitance.

Figure 6:
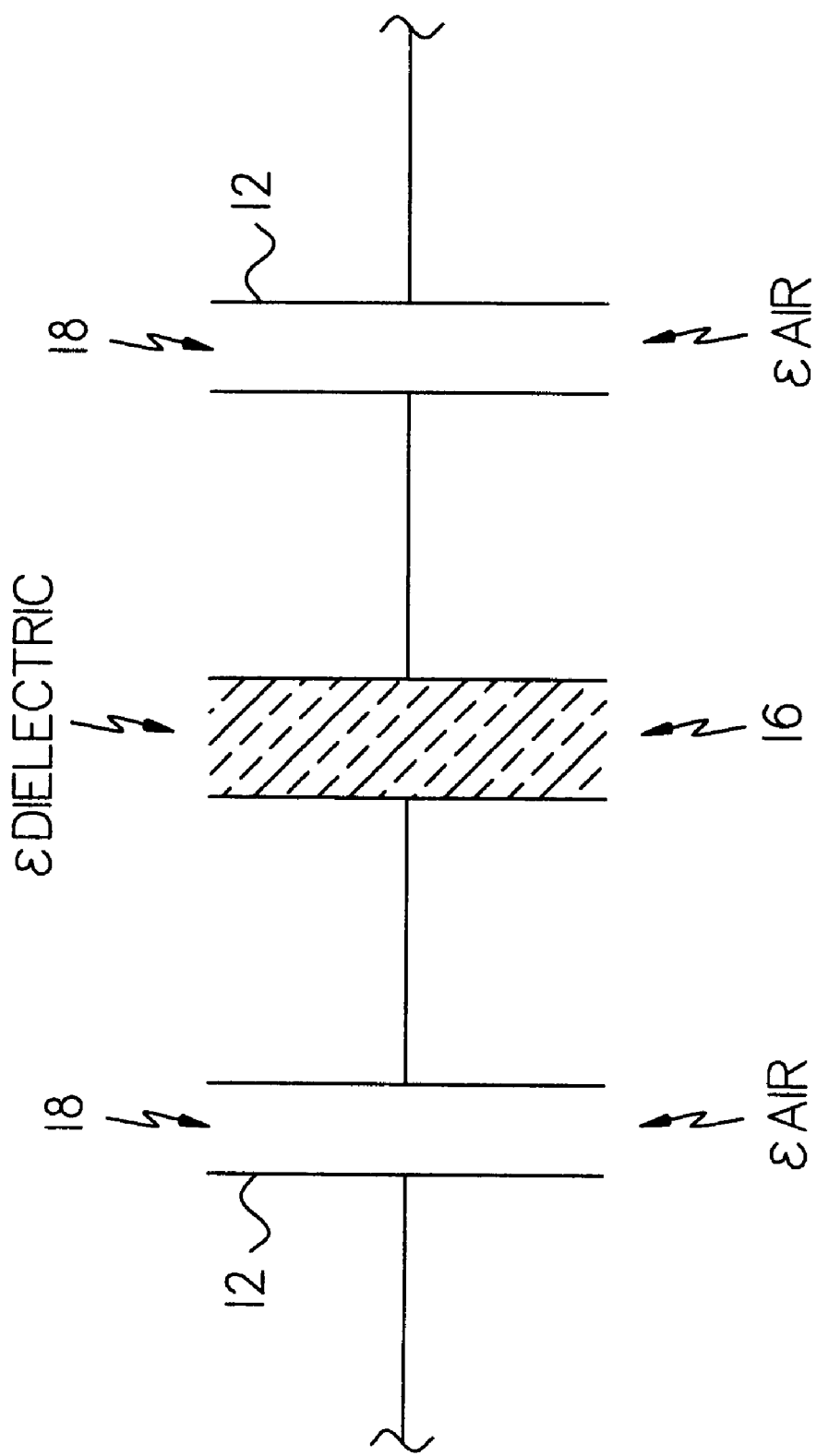
FIG. 6 is an electrical schematic representation of an integrated circuit constructed in accordance with the present invention.

Referring to FIG. 6, conductive lines 12 of FIGS. 1 through 5 form the plates of a capacitor. Air gaps 18, formed on either side of dielectric material 16, result in a capacitor in series circuit. The net capacitance of this circuit is:

$$C = 1/(1/C_{air} + 1/C_d + 1/C_{air}) \quad (1)$$

Where:

$C_{air}$ is the capacitance each air gap 18, and $C_d$ is the capacitance of dielectric material 16.

Each capacitance can be expressed as:

$$C = \epsilon A/l \quad (2)$$

Where:

$\epsilon$ is the dielectric constant of dielectric material 16,

A is the cross-sectional area of opposing metal lines, and l is the thickness of dielectric material 16.

Substituting equation (2) for $C_{air}$ in equation (1):

$$C/A = [2d_{air} + 1_d/\epsilon_d]^{-1} \quad (3)$$

For Silicon dioxide, $\epsilon_d = 3.85$.

Using equation (3), the capacitance for air gaps of varying width can be calculated. For a $0.18\mu$ ground rule, with dimensions in microns:

| lair | ld | C/A | Equivalent $\epsilon$ |
|------|------|-------|------|
| 0    | 0.18 | 21.39 | 3.85 |
| 0.01 | 0.16 | 16.24 | 2.92 |
| 0.02 | 0.14 | 13.10 | 2.36 |
| 0.03 | 0.12 | 10.97 | 1.97 |
| 0.04 | 0.1  | 9.44  | 1.70 |
| 0.05 | 0.08 | 8.28  | 1.49 |

First generation (inorganic) low-k materials have an $\epsilon$ greater than 3.5, and even organic low-k materials have an $\epsilon$ near 2.8 following anneal. It is apparent that a significant advantage in the dielectric constant can be achieved using the method of the present invention. Moreover, the present invention can be used with many different dielectric materials, including low-k materials, to achieve even lower line-to-line capacitance.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An integrated circuit comprising:

a stud dielectric layer;

a metal layer on the stud dielectric layer, the metal layer having conductive lines with surfaces facing one another and defining spaces between the surfaces that are no greater than the widths of said conductive lines; and a dielectric material in the spaces between the surfaces of the conductive lines of the metal layer facing one another and spaced from the conductive lines of the metal layer by air gaps.

2. The integrated circuit according to claim 1 wherein the air gaps taper away downwardly from the conductive lines.

3. The integrated circuit according to claim 2 further comprising a second stud dielectric layer above the metal layer, the air gaps, and the dielectric material.

4. The integrated circuit according to claim 1 wherein the stud dielectric layer is one of tetraethoxysilane and oxide.

5. The integrated circuit according to claim 1 wherein the metal layer is one of aluminum and copper.

6. The integrated circuit according to claim 1 wherein the dielectric material is one of tetraethoxysilane and oxide.

7. An integrated circuit comprising:

a stud dielectric layer that is one of tetraethoxysilane and oxide;

a metal layer on the stud dielectric layer, and the metal layer having conductive lines with surfaces facing one another defining spaces between the surfaces that are no greater than the widths of said conductive lines, said conductive lines being one of aluminum and copper;

a dielectric material in the spaces between the surfaces of the conductive lines of the metal layer facing one another and spaced from the conductive lines of the metal layer by air gaps, the dielectric material being one of tetraethoxysilane and oxide; and a second stud dielectric layer above the metal layer, the air gaps, and the dielectric material.

\* \* \* \* \*